United States Patent [19]

Saitoh

[11] Patent Number: 5,285,259
[45] Date of Patent: Feb. 8, 1994

[54] POSITION DETECTING METHOD

[75] Inventor: Kenji Saitoh, Yokohama, Japan

[73] Assignee: Canon Kabushiki Kaisha, Tokyo, Japan

[21] Appl. No.: 733,829

[22] Filed: Jul. 22, 1991

[30] Foreign Application Priority Data

Jul. 23, 1990 [JP] Japan ................................. 2-195337

[51] Int. Cl.$^5$ .............................................. G01B 11/00
[52] U.S. Cl. ................................................... 356/401
[58] Field of Search .............................. 356/399–401; 250/548

[56] References Cited

U.S. PATENT DOCUMENTS 4,704,033 11/1987 Fay et al. ............................ 356/363
4,862,318 10/1990 Nishi ................................... 356/401

FOREIGN PATENT DOCUMENTS 0355496 2/1990 European Pat. Off. .

Primary Examiner—Richard A. Rosenberger
Assistant Examiner—K. P. Hantis
Attorney, Agent, or Firm—Fitzpatrick, Cella, Harper & Scinto

[57] ABSTRACT

A position detecting method is disclosed a radiation beam is projected to a grating pattern on a substrate, wherein a diffraction beam from the pattern and a reflectively scattered beam from an edge of a peripheral portion of the pattern are received by a sensor array and the position of the substrate is determined on the basis of a signal from the sensor array. On the sensor array, the diffraction beam and the reflectively scattered beam are substantially separated from each other. From a signal produced by the sensor array, a signal corresponding to the diffraction beam is extracted. The position of the substrate is determined on the basis of the extracted signal.

29 Claims, 11 Drawing Sheets

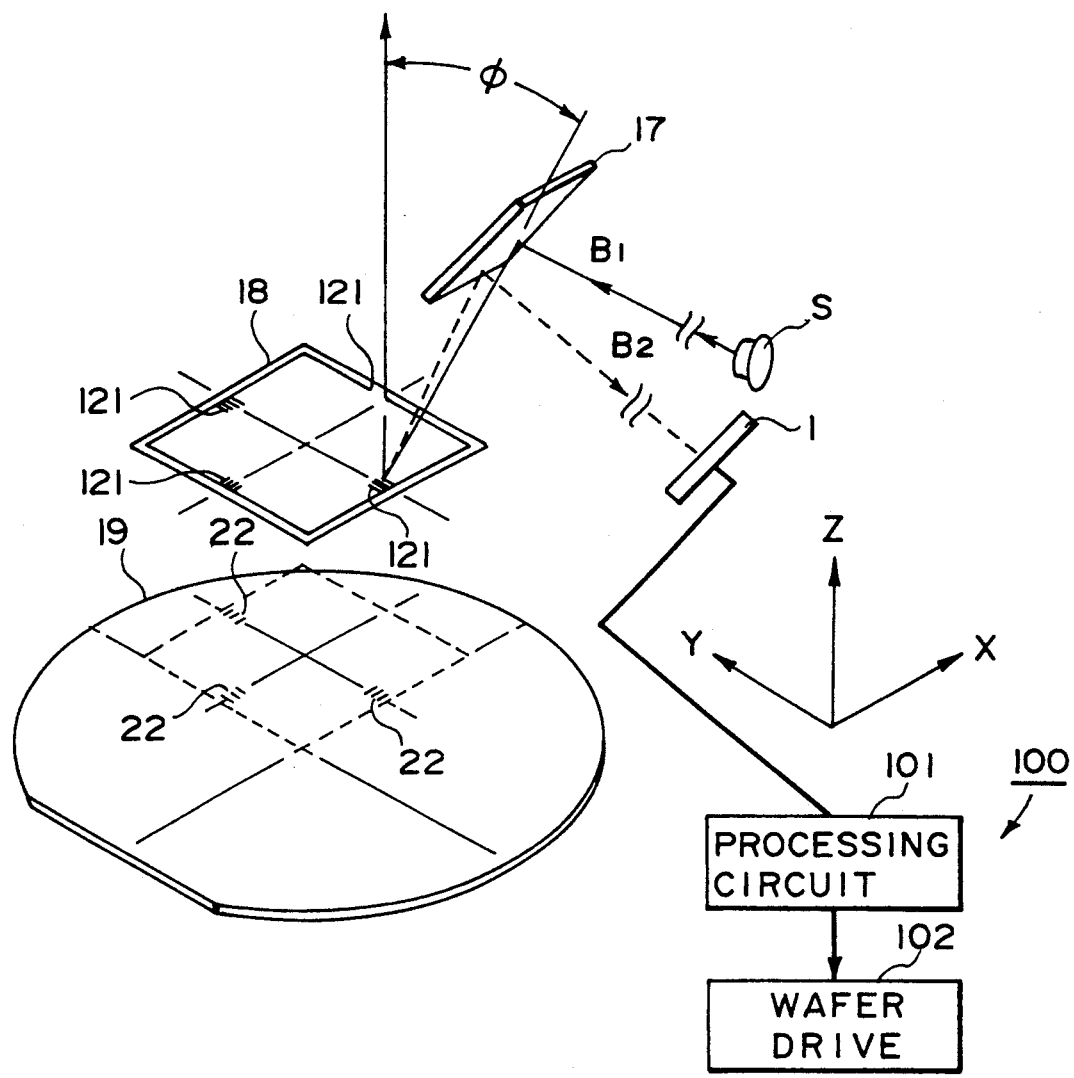
F I G. 4A

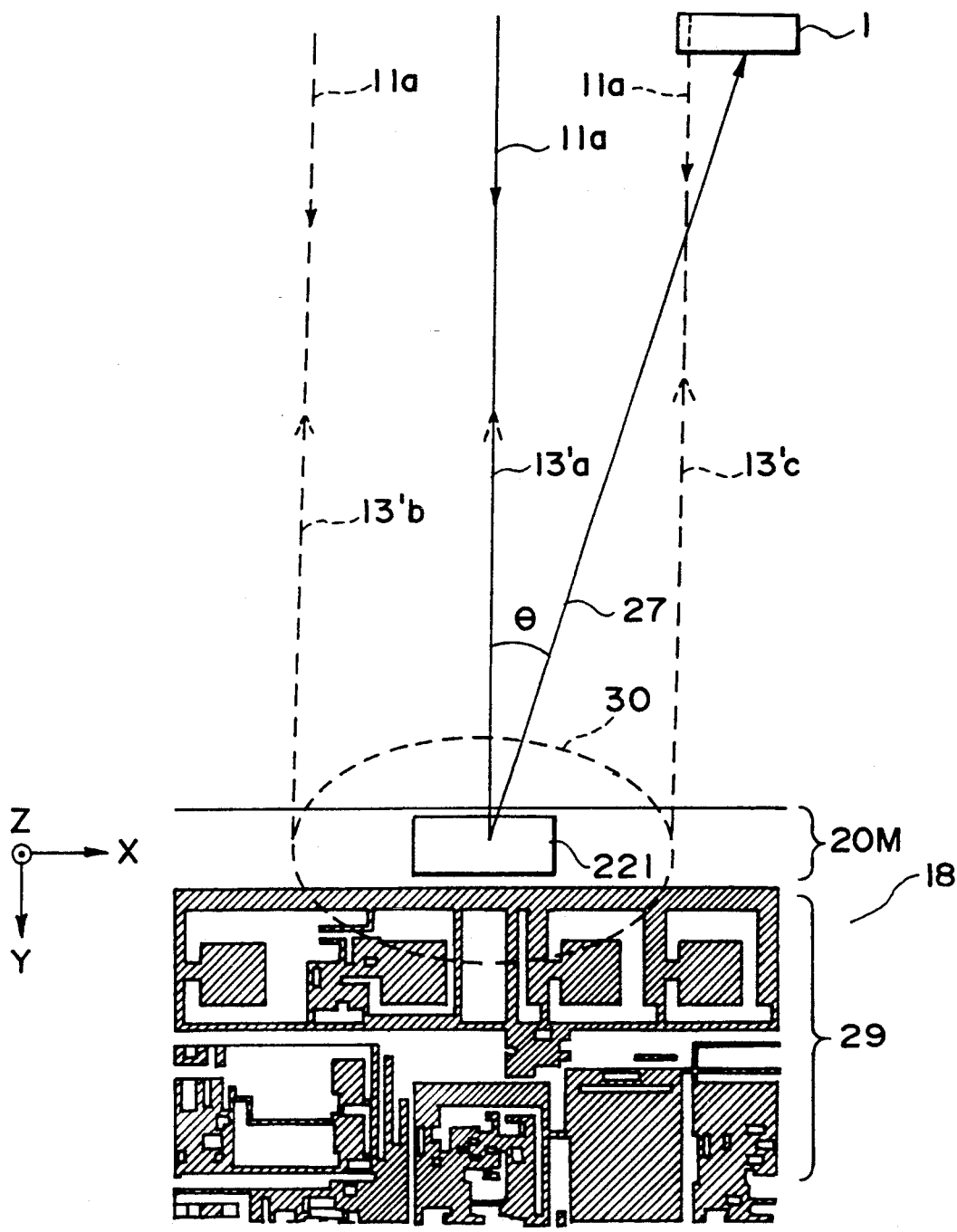
F I G. 9A

POSITION DETECTING METHOD

FIELD OF THE INVENTION AND RELATED ART

This invention relates generally to a position detecting method suitably usable, for example, in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the precision of relative alignment of a mask and a wafer is one important factor with respect to ensuring improved performance. Particularly, as for alignment systems employed in recent exposure apparatuses, submicron alignment accuracies or more strict accuracies are required in consideration of the demand for higher degrees of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. No. 4,704,033 wherein so-called zone plates are used as alignment patterns upon which light is projected and wherein the quantity of light on a predetermined plane from the illuminated zone plates is detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates. FIG. 2 illustrates alignment marks of a mask and a wafer. The mask 18 is provided with four alignment marks 21 each being formed by a linear zone plate, and the wafer 19 is provided with four alignment marks 22 each being formed by a grating pattern having square dots (grating elements) arrayed in a line with regular pitch. In each linear zone plate 21, the direction in which the linear zone plate has a light converging or diverging function (i.e., power) is the direction with respect to which any positional error is to be detected. Hereinafter, such a direction will be referred to as a "positional deviation detecting direction" or "alignment detecting direction". Light beam B1 projected from a light source S is inputted by way of a mirror 17 to a zone plate 21 along a plane, which contains a normal Z to the center of the zone plate and which is perpendicular to the positional deviation detecting direction, obliquely at a certain angle Φ with respect to the normal (z axis). By this zone plate 21, the light is converged rectilinearly on the wafer surface. Then, the light is diffracted by a corresponding grating pattern 22, such that it emanates from the wafer along a plane (plane of incidence), containing a normal and the path of the beam B1, at an angle as determined by the pitch of the grating pattern 22. Thus, the light emanates from the wafer as a signal light B2 which, after being reflected by the mirror 17, impinges on a photodetector D.

The spacing between the mask 18 and the wafer 19 is illustrated in the drawing in an enlarged scale. Actually, the mask 18 and the wafer 19 are very close to each other with a gap on an order of 100 microns or less. If the mask 18 and the wafer 19 have relative positional deviation, the quantity of signal light B2 produced by the diffraction through the grating pattern 22 changes. This causes a change in the quantity of light as received by the photodetector D. Once such a change is detected, it is possible to correct the positional deviation between the mask 18 and the wafer 19 by using a control means, not shown. If, as an example, the zone plate 21 and the grating pattern 22 are designed so that the center of the linearly focused light spot as formed on the wafer 19 surface by the zone plate 21 of the mask is aligned with the center of the grating pattern 22 of the wafer 19 with respect to the positional deviation detecting direction when the mask 18 and the wafer 19 are placed in correct alignment with each other, then the correct alignment of the mask and the wafer can be discriminated as the quantity of light received by the photodetector D becomes maximum. Namely, for alignment, the wafer 19 is displaced in the positional deviation detecting direction until the quantity of light received by the photodetector becomes maximum.

In this illustrated example, however, each zone plate 21 or each grating pattern is set so that the edge of its outer peripheral part extends substantially perpendicularly to the light incident thereon. Additionally, detection of the signal light B2 uses the light path near the plane of incidence. This results in a problem of a high possibility that regularly-reflected scattered light produced by such an edge and having high intensity enters the light receiving surface of the photodetector as strong noise light.

Here, the regularly-reflected scattered light means such scattered light as produced by an edge of a pattern and having a distribution of rays, distributed about a reflected ray produced by the reflection, according to the law of reflection, of a chief ray of a beam inputted to the reflection surface of the edge. The edge of a pattern can be considered as a cylindrical reflection surface having an infinitely small radius and having a generating line extending parallel to the elongating direction of the edge.

Particularly, in a mask to be used in an X-ray exposure apparatus, the mask pattern has a large thickness and such a regularly-reflected scattered light is strong.

FIGS. 3A-3C illustrate an edge 12 of an alignment pattern and a part around the light receiving surface 14 of the photodetector D, wherein FIG. 3A is a front elevational view, FIG. 3B is a top plan view and FIG. 3C is a side sectional view.

In FIGS. 3A-3C, when a light beam B1 impinges on the edge portion 12 of the pattern, scattered light 13 is produced at this edge portion 12. Here, almost all the scattered light 13 is produced within a certain range about and close to the direction of advancement of a regularly reflected light 13' which is produced by the regular reflection of the chief ray of the inputted light B1 by the edge 12, as seen in FIG. 3B. In FIGS. 3B and 3C, a broken line depicts the intensity distribution of the rays of the scattered light 13 having different angles. FIG. 13A illustrates the distribution of the regularly-reflected scattered light 13' in the plane of incidence. It is seen that strong scattered light is incident at the central part of the light receiving surface 14 of the photodetector. The incidence of such regularly-reflected scattered light prevents enhancement of precision for the detection of the position of an article such as a mask or wafer.

SUMMARY OF THE INVENTION

It is accordingly a primary object of the present invention to provide a position detecting method by which the position of an article to be examined can be detected with enhanced correctness and precision.

In accordance with a first aspect of the present invention, to achieve such an object, there is provided a position detecting method, wherein a radiation beam is projected to a grating pattern on a substrate, wherein a diffraction beam from the pattern and a reflectively scattered beam from an edge of a peripheral portion of the pattern are received by a sensor array and wherein the position of the substrate is determined on the basis of a signal from the sensor array, the improvements residing in that: on the sensor array, the diffraction beam and the reflectively scattered beam are substantially separated from each other; from a signal produced by the sensor array, a signal corresponding to the diffraction beam is extracted; and the position of the substrate is determined on the basis of the extracted signal.

In accordance with a second aspect of the present invention, there is provided a position detecting method, wherein a radiation beam is projected to a first substrate by which a diffraction beam is produced through a grating pattern on the first substrate and a grating mark on a second substrate, wherein the produced diffraction beam and a reflectively scattered beam from an edge of a peripheral portion of the grating pattern are received by a sensor array and wherein the position of the second substrate relative to the first substrate is determined on the basis of a signal from the sensor array, the improvements residing in that: on the sensor array, the diffraction beam and the reflectively scattered beam are substantially separated from each other; from a signal produced by the sensor array, a signal corresponding to the diffraction beam is extracted; and the position of the second substrate relative to the first substrate is determined on the basis of the extracted signal.

In accordance with a third aspect of the present invention, there is provided a position detecting method, wherein a radiation beam is projected to a linear zone plate on a first substrate by which a linear beam is produced, wherein the produced linear beam is projected to a linear grating mark on a second substrate, wherein a diffraction beam emanating from the grating mark in a predetermined direction and a reflectively scattered beam from an edge of a peripheral portion of the zone plate, are received by a sensor array, wherein the position of the second substrate relative to the first substrate is determined on the basis of a signal from the sensor array and wherein the intensity of the diffraction beam is changeable with the position of the linear grating mark relative to the linear beam, the improvements residing in that: on the sensor array, the diffraction beam and the reflectively scattered beam are substantially separated from each other; from a signal produced by the sensor array, a signal corresponding to the diffraction beam is extracted; and the position of the second substrate relative to the first substrate is determined on the basis of the extracted signal.

In accordance with a fourth aspect of the present invention, there is provided a position detecting method, wherein a radiation beam is projected to a first zone plate on a first substrate, wherein a diffraction beam from the first zone plate is projected to a second zone plate on a second substrate, wherein the diffraction beam diffracted again by the second zone plate and a reflectively scattered beam from an edge of a peripheral portion of the first zone plate are received by a sensor array, wherein the position of the second substrate relative to the first substrate is determined on the basis of a signal from the sensor array, and wherein the position of incidence of the diffraction beam upon the sensor array is changeable with the position of the second zone plate relative to the first zone plate, the improvements residing in that: on the sensor array, the diffraction beam and the reflectively scattered beam are substantially separated from each other; from a signal produced by the sensor array, a signal corresponding to the diffraction beam is extracted; and the position of the second substrate relative to the first substrate is determined on the basis of the extracted signal.

In accordance with a fifth aspect of the present invention, there is provided a position detecting method, wherein a radiation beam is projected to a grating pattern on a substrate, wherein a diffraction beam from the pattern and a reflectively scattered beam from an edge of a peripheral portion of another pattern, adjacent to the grating pattern, are received by a sensor array, and wherein the position of the substrate is determined on the basis of a signal from the sensor array, the improvements residing in that: on the sensor array, the diffraction beam and the reflectively scattered beam are substantially separated from each other; from a signal produced by the sensor array, a signal corresponding to the diffraction beam is extracted; and the position of the substrate is determined on the basis of the extracted signal.

In accordance with a sixth aspect of the present invention, there is provided a position detecting method, wherein a radiation beam is projected to a first substrate by which a diffraction beam is produced through a grating pattern on the first substrate and a grating mark on a second substrate, wherein the produced diffraction beam and a reflectively scattered beam from an edge of a peripheral portion of another pattern, adjacent to the grating pattern, are received by a sensor array and wherein the position of the second substrate relative to the first substrate is determined on the basis of a signal from the sensor array, the improvements residing in that: on the sensor array, the diffraction beam and the reflectively scattered beam are substantially separated from each other; from a signal produced by the sensor array, a signal corresponding to the diffraction beam is extracted; and the position of the second substrate relative to the first substrate is determined on the basis of the extracted signal.

In accordance with a seventh aspect of the present invention, there is provided a position detecting method, wherein a radiation beam is projected to a first zone plate on a first substrate, wherein a diffraction beam from the first zone plate is projected to a second zone plate on a second substrate, wherein the diffraction beam diffracted again by the second zone plate and a reflectively scattered beam from an edge of a peripheral portion of a pattern, adjacent to the first zone plate, are received by a sensor array, wherein the position of the second substrate relative to the first substrate is determined on the basis of a signal from the sensor array and wherein the position of incidence of the diffraction beam upon the sensor array is changeable with the position of the second zone plate relative to the first zone plate, the improvements residing in that: on the sensor array, the diffraction beam and the reflectively scattered beam are substantially separated from each other; from a signal produced by the sensor array, a signal corresponding to the diffraction beam is extracted; and the position of the second substrate relative to the first substrate is determined on the basis of the extracted signal.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A–4C show a first embodiment of the present invention, wherein FIG. 4A is a perspective view of a position detecting system according to this embodiment, FIG. 4B is an enlarged top plan view of a mask mark and FIG. 4C is an enlarged top plan view of a wafer mark.

FIGS. 5A–5C illustrate regularly-scattered light in the first embodiment of the present invention, wherein FIG. 5A is a front view of the detector, FIG. 5B is a top view showing the detector and an edge of a mask mark, and FIG. 5C is a side sectional view of the mask mark.

FIGS. 9A–9E show a position detecting system according to a further embodiment of the present invention, wherein FIG. 9A is a top view showing a mask and a detector, FIG. 9B is a top view showing a mask mark, FIG. 9C is a side sectional view showing a mask mark and diffraction light, FIG. 9D is a top view showing a wafer mark and reflective diffraction light, FIG. 9E is a side sectional view showing a wafer mark and reflective diffraction light.

DESCRIPTION OF THE PREFERRED EMBODIMENTS

Figure 4B:
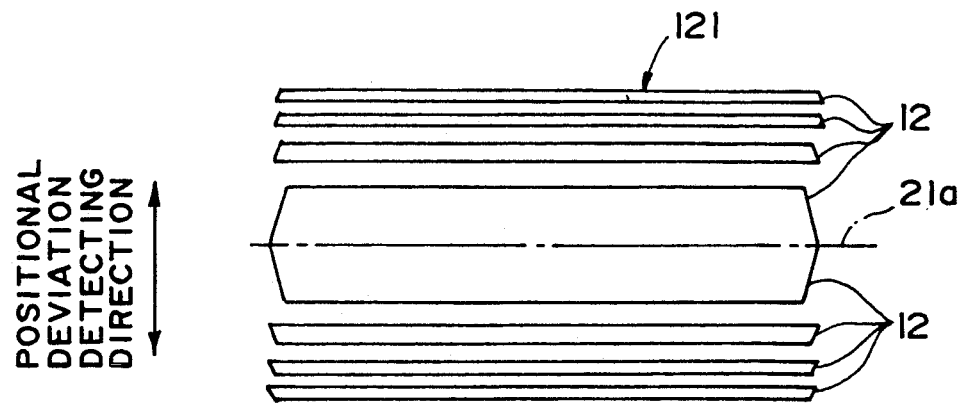
Figure 4C:
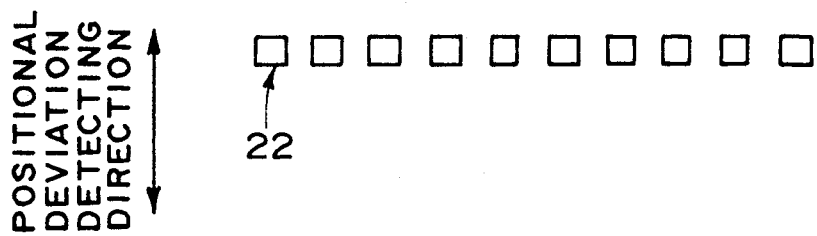

FIGS. 4A–4C illustrate a first embodiment of the present invention, wherein FIG. 4A is a perspective view of a major part of this embodiment and FIGS. 4B and 4C are enlarged top plan views of marks (121 and 22) provided on a mask (first object) 18 and a wafer (second object) 19, respectively, for the position detection. Each mark 121 comprises a linear zone plate, while each mark 22 comprises a linear grating pattern provided by an array of rectangular patterns.

Figure 1:
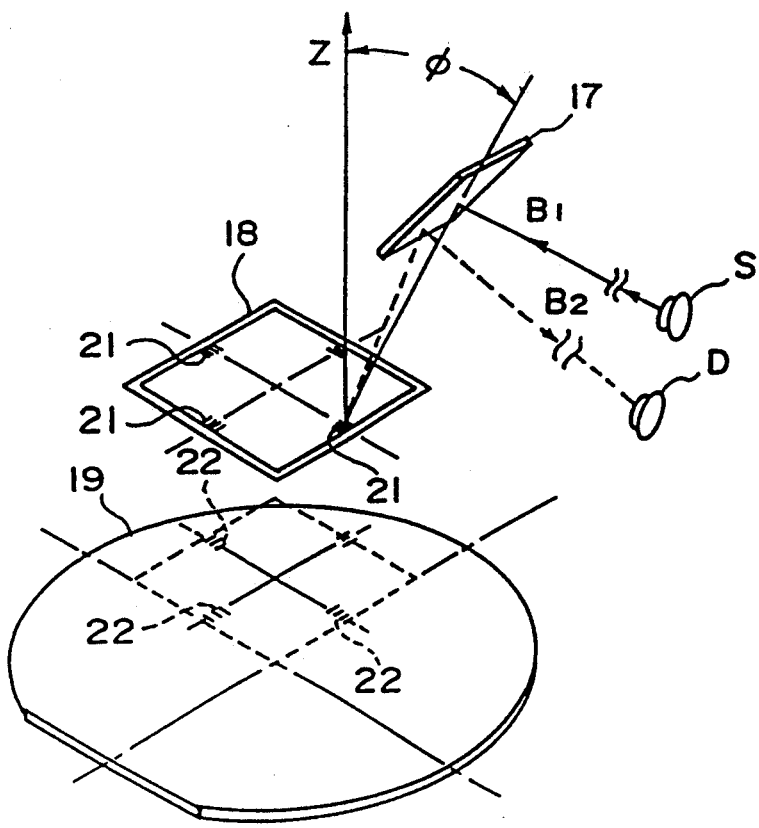
FIG. 1 is a perspective view, schematically showing a position detecting system of a known type.
Figure 2:
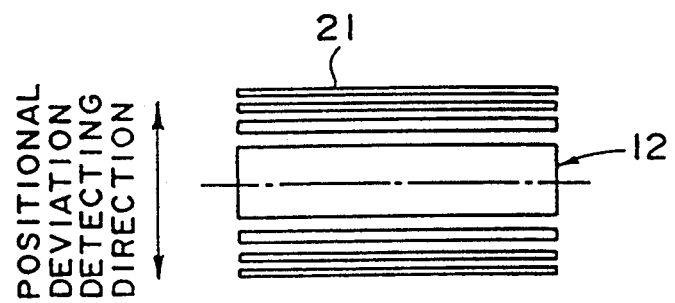
FIG. 2 is a schematic view, showing a mask alignment mark and a wafer alignment mark used in the FIG. 1 system.
Figure 2:
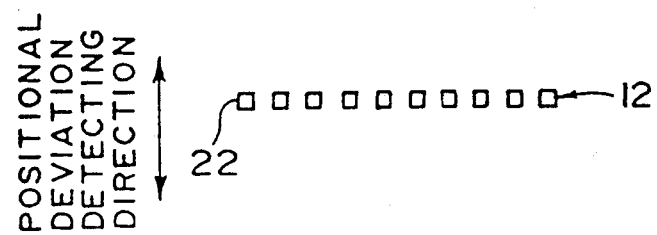
Figure 3A:
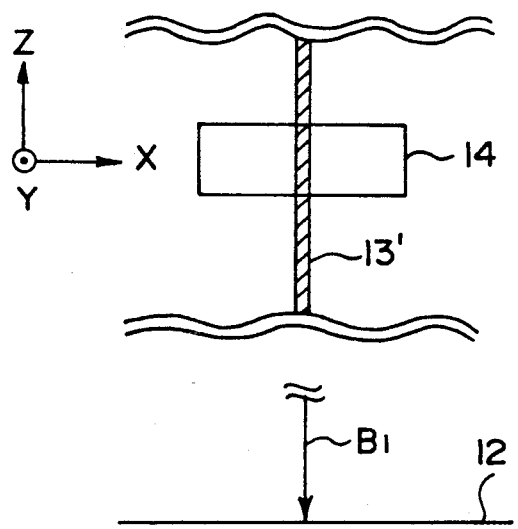
FIGS. 3A–3C are schematic representations, respectively, for explaining the production of regularly-reflected scattered light.
Figure 3B:
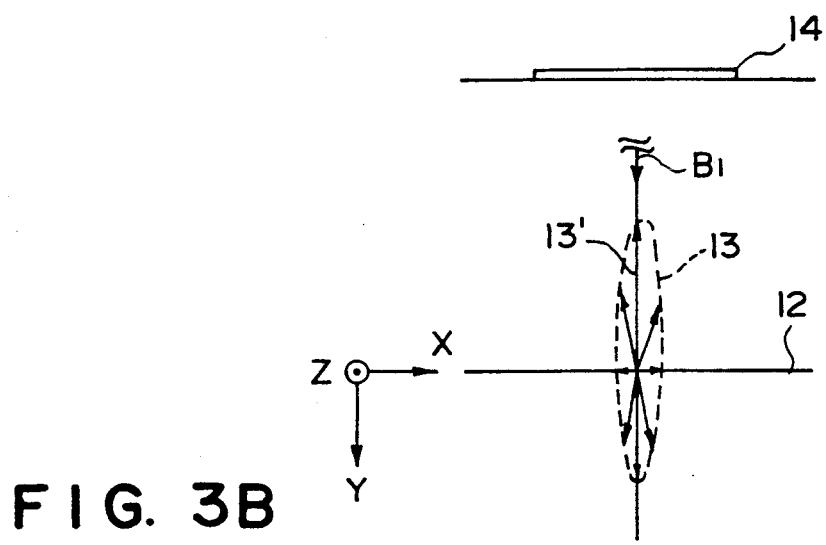
Figure 3C:
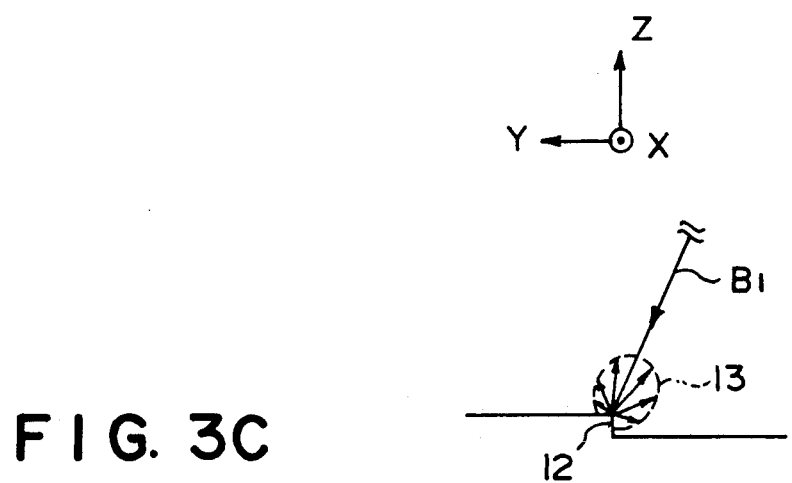

This embodiment differs from the position detecting system of the FIG. 1 example in the point of the shape of each mark on the mask 18 surface and the arrangement of the detector as well as the signal processing manner. The structure of the remaining portion is essentially the same as the FIG. 1 example.

More specifically, in the present embodiment, light $B_1$ projected from a light source S is reflected by a mirror 17 and then is incident on a zone plate 121 within a plane (incidence plane) (y-z plane). containing a normal (z axis) to the center of the mark 121 and being perpendicular to the positional deviation detecting direction (x axis), with a certain angle $\phi$ with respect to the normal (z axis) to the center of the zone plate. Under the influence of the optical power of the zone plate 121, the received light is converged linearly on the wafer 19 surface to provide a linear beam. This linear beam is diffracted by a linear grating pattern 22 on the wafer 19 surface and it emanates in the incidence plane (y-z plane) as a signal light $B_2$ with a predetermined angle different from the angle $\phi$ and determined by the pitch of the pattern 22. Then, it is reflected by the mirror 17 and is received by a detector 1 comprising a sensor array.

If the wafer 19 is deviated in the alignment direction (x direction) with respect to the mask 18, from a predetermined position, the light quantity of the beam $B_1$ diffracted by the pattern 22 on the wafer 19 surface changes in accordance with the amount of the deviation. As a result, the light quantity of the signal light $B_2$ as received by the detector 1 changes accordingly. Thus, by detecting this light quantity, the positional deviation of the wafer 19 to the mask 18 can be detected and then corrected under the control of a control means 100, including a processing circuit 101 and a driving system 102. Here, the marks 121 and 22 are so designed that, when the mask 18 and the wafer 19 are in correct alignment with each other, the center line of the linear beam upon the wafer 19 surface coincides with the center line of the pattern 22, such that "zero (0) positional deviation", i.e., "correct alignment" can be discriminated through the processing circuit as the light quantity received by the detector 1 is maximum. Namely, the wafer 19 is so displaced by the driving system 102 in the positional deviation detecting direction that the light quantity of the signal light $B_2$ changes to its highest level and, by doing so, the alignment of the mask 18 and the wafer 19 can be achieved.

In this embodiment, as best seen in FIG. 4B, each pattern of the zone plate 121 has it ends 12 cut obliquely and symmetrically with respect to the center line 21a of the zone plate 121. As described, the input beam $B_1$ impinging on the zone plate 121 is incident thereon with an angle $\phi$ with respect to a normal to the mask 18 surface, within a plane (incidence plane) (y-z plane) containing the normal to the mask surface and being perpendicular to the positional deviation detecting direction (x direction). The detector 1 receives the diffraction light $B_2$ coming thereto along the incidence plane (y-z plane) of the input beam $B_1$, to the input beam $B_1$ side of the normal. Since the ends 121 are cut obliquely as shown in FIG. 4B (with an angle 3.5 deg. to the positional deviation detecting direction, in this example), the regularly-reflected scattered light from each end (edge) 12 does not advance along the incidence plane (in which the paths of the input beam $B_1$ and the signal light $B_2$ are included), except for the direction of the normal.

Consequently, around the center of the detector 1 which is so disposed as to receive the diffraction light (signal light) $B_2$ coming along the incidence plane (not in the direction of the normal), the regularly-reflected scattered light does not impinge thereon. Rather, it impinges on a peripheral portion of the detector 1. Thus, the signal light $B_2$ and the regularly-reflected scattered light are surely separated from each other, upon the detector 1 surface.

Figure 5A:
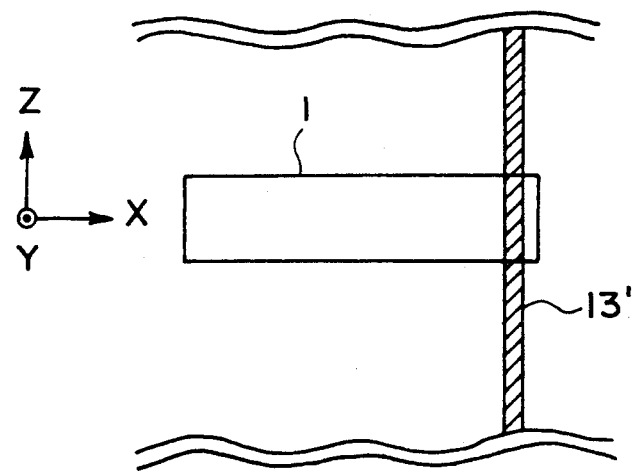
Figure 5B:
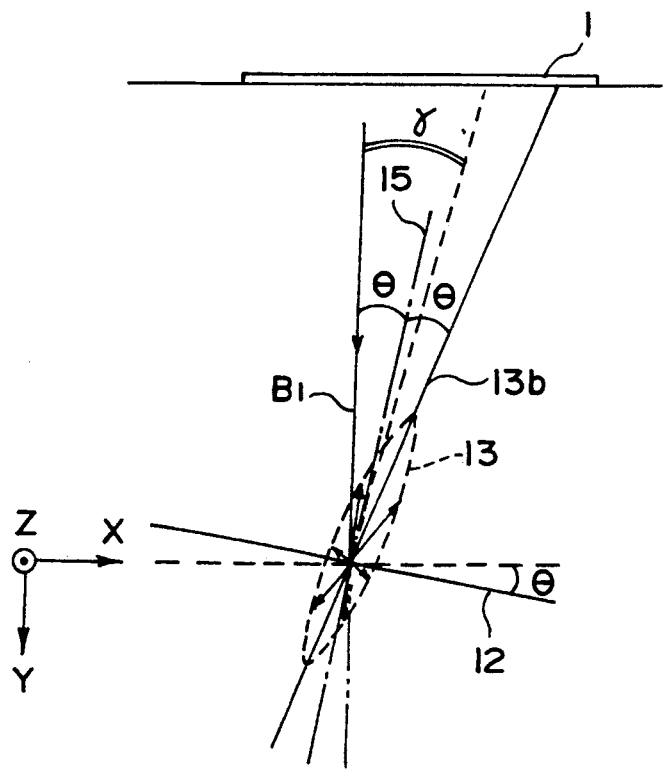
Figure 5C:
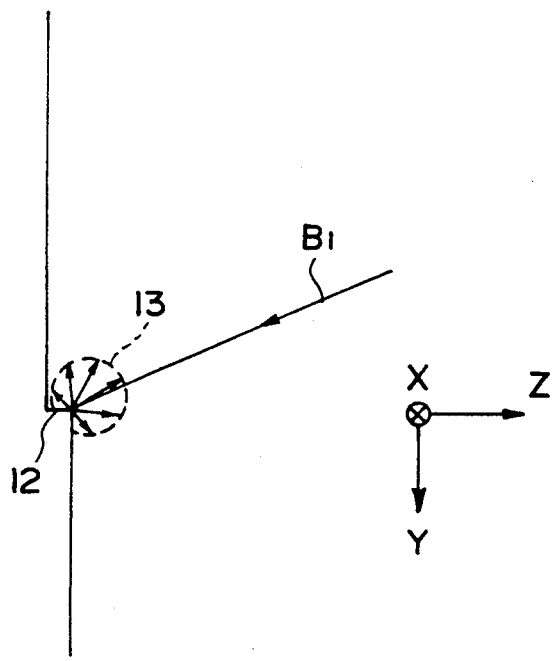

FIGS. 5A–5C illustrate regularly-reflected scattered light 13′ from an edge 12 (FIG. 4B) of a mark 121, wherein FIG. 5A is a front view of the detector 1, FIG. 5B is a top view showing a portion the mark 121 adjacent to the detector 1, and FIG. 5C is a side sectional view of the edge of the mark 121. In FIGS. 5B and 5C, the edge 12 of the mark 121 is shown in an enlarged scale.

If the projection to the x-y plane of the mark 121 is such as shown in FIG. 5B, the light $B_1$ obliquely incident on the edge 12 of the mark 121 with an angle $\theta$ (3.5 deg. in this example) with respect to a normal 15 to the x-y plane of the edge 12, is reflected in the direction of regular reflection, denoted at 13$b$, having the same or symmetrical angle $\theta$ with respect to the normal, to thereby provide a regularly-reflected scattered light 13 which has a substantial intensity. Viewing such regularly-reflected scattered light 13 in terms of the projection to the incidence plane (y-z plane), as shown in FIG. 5C, it is seen that the scattered light 13 consists of light rays scattered by the edge 12 in unlimited directions. Also, upon the detection surface (light receiving surface) of the detector 1, the regularly-reflected scattered light 13′ impinges in the form of a linear beam, as shown in FIG. 5A.

The detector 1 may comprise a one-dimensional sensor of charge coupling type (such as a CCD linear sensor), for example, with picture elements of a number 2048 of a picture element size of 13 (transverse)×130 (longitudinal) (microns), adapted to execute photoelectric conversion. The electric charges accumulated through photoelectric conversion by the picture elements are transferred from the picture elements to a shift register and then through a charge detecting means. After passing through an output amplifier, comprising a source follower, they are outputted from the sensor, and the light intensities corresponding to the picture elements of the detector 1 are memorized into a waveform memory of the processing circuit 101. After analog-to-digital conversion, the data is transferred to a microcomputer of the processing circuit 101. In the microcomputer, the transferred data of "256 gradations" corresponding to the light quantities received by the picture elements of the detector 1 is processed in the manner to be described below.

Figure 6:
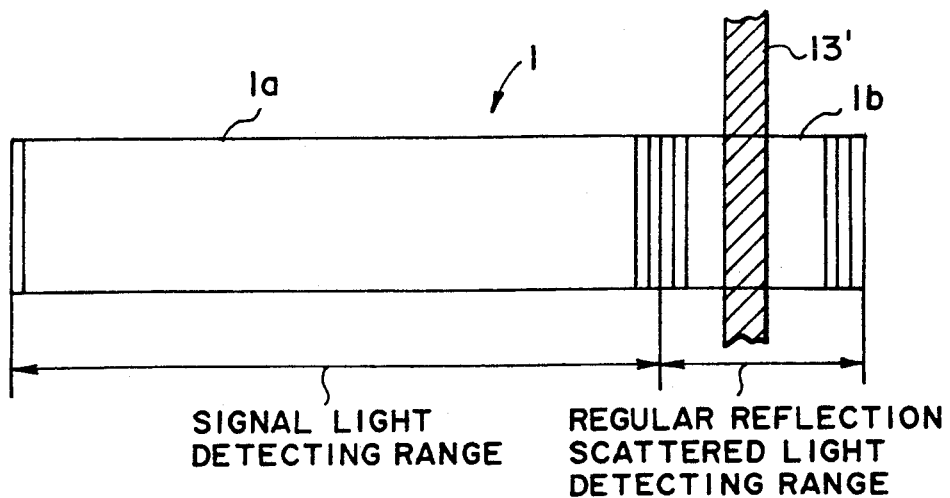
FIG. 6 is a schematic view for explaining the range setting of a sensor array, for detection of signal light and regularly-reflected light.

First, the detection surface (light receiving surface) of the detector 1 is divided into plural regions, that is, a first region (signal light detecting region) for detecting the signal light $B_2$ which bears positional information related to the relative position of the wafer 19 relative to the mask 18, and a second region (regularly-reflected scattered light detecting region) for detecting noise light consisting of the regularly-reflected scattered light. This is illustrated in FIG. 6 which is a schematic view of the detection surface of the detector 1 of the present embodiment. In the drawing, denoted at 1$a$ is the signal light detecting region, and denoted at 1$b$ is the regularly-reflected scattered light detecting region. Since in this embodiment each end (edge) 12 of the mark 121 patterns has been cut obliquely and symmetrically with respect to the center line 21$a$, there is a possibility that a pair of regularly-reflected scattered lights 13′ produced by the edges 12 of upper and lower patterns, at upper and lower sides of the center line 1$a$, impinge on the detection surface of the detector 1. However, for simplicity, only one regularly-reflected scattered light 13′ is illustrated in the drawing.

In FIG. 6, the range setting is based on prediction of such a picture element area of the detection surface of the detector 1 on which regularly-reflected scattered light 13′ of large intensity is to be incident. The prediction may be done on the basis of the arrangement of the mark 121 as well as the disposition of the components of the system. However, the range setting to the detection surface of the detector 1 may be done on the basis of an intensity distribution of the detected light itself. For example, first the regularly-reflected light detecting region may be determined roughly and, then, such a picture element showing a maximum level, of the picture elements in that region showing a certain level not lower than a predetermined, may be determined. Then, about the determined position (picture element), a certain picture element range $\pm m$ (m may be determined appropriately in accordance with the design) may be defined as the detecting region 1$b$ for the detection of the regularly-reflected scattered light. The remaining area may be determined as the signal light detecting region 1$a$.

Next, without using the picture element data corresponding to the region 1$b$, the microcomputer of the processing circuit 101 executes integration of the picture element data corresponding to the signal light detecting region 1$a$. In this integration, weighting based on the position of each picture element may be done. After this, like the FIG. 1 example, the wafer 19 or the mask 18 is moved by the driving system 102 along the positional deviation detecting direction (x direction) until the quantity of the signal light becomes maximum. By this, the mask-to-wafer alignment is completed. Thereafter, the mask and the wafer are exposed with light, for example, whereby the circuit pattern of the mask is printed on the wafer, for production of semiconductor chips.

Figure 7:
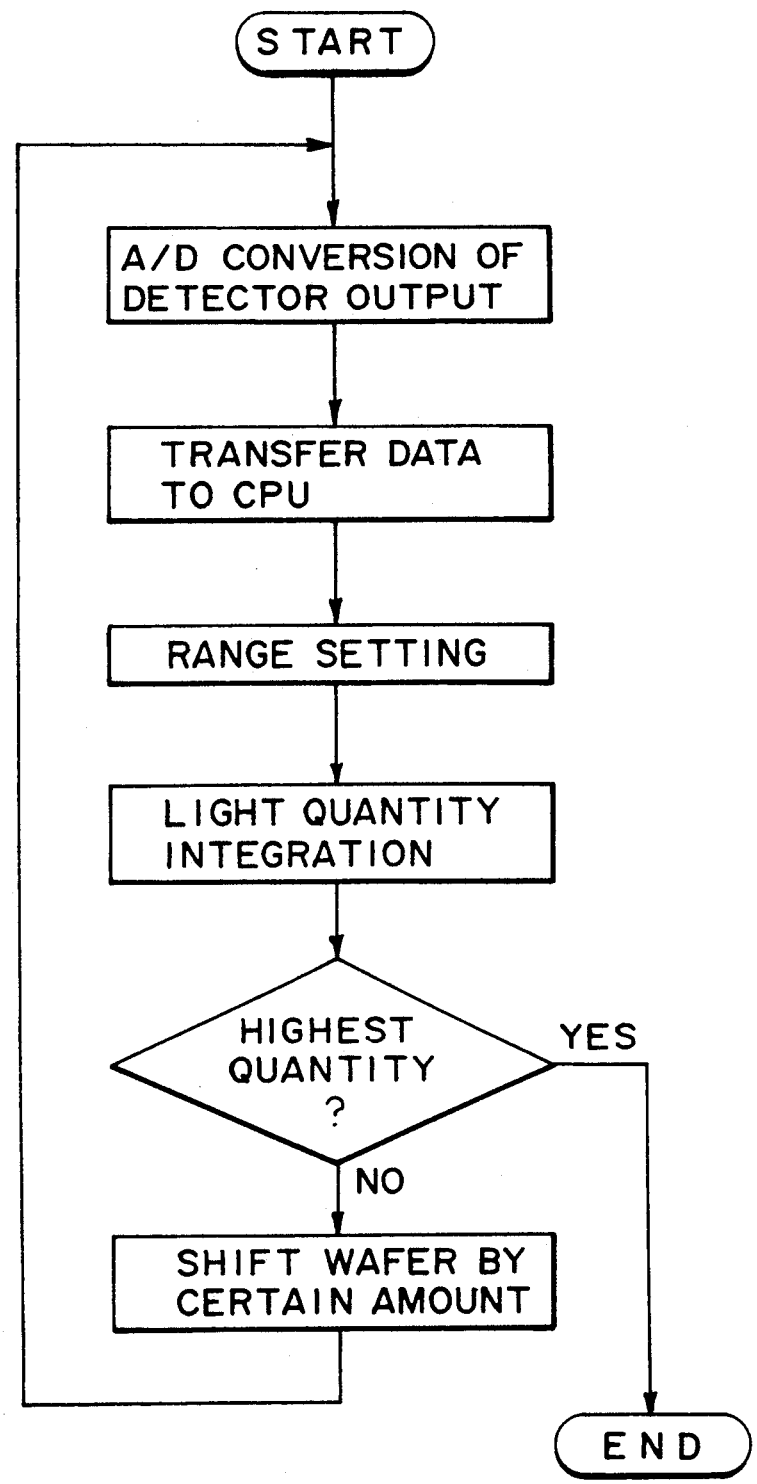
FIG. 7 is a flow chart showing the alignment procedure in the embodiment of FIG. 4A.

FIG. 7 is a flow chart showing the alignment procedure according to this embodiment of the present invention.

Figure 8:
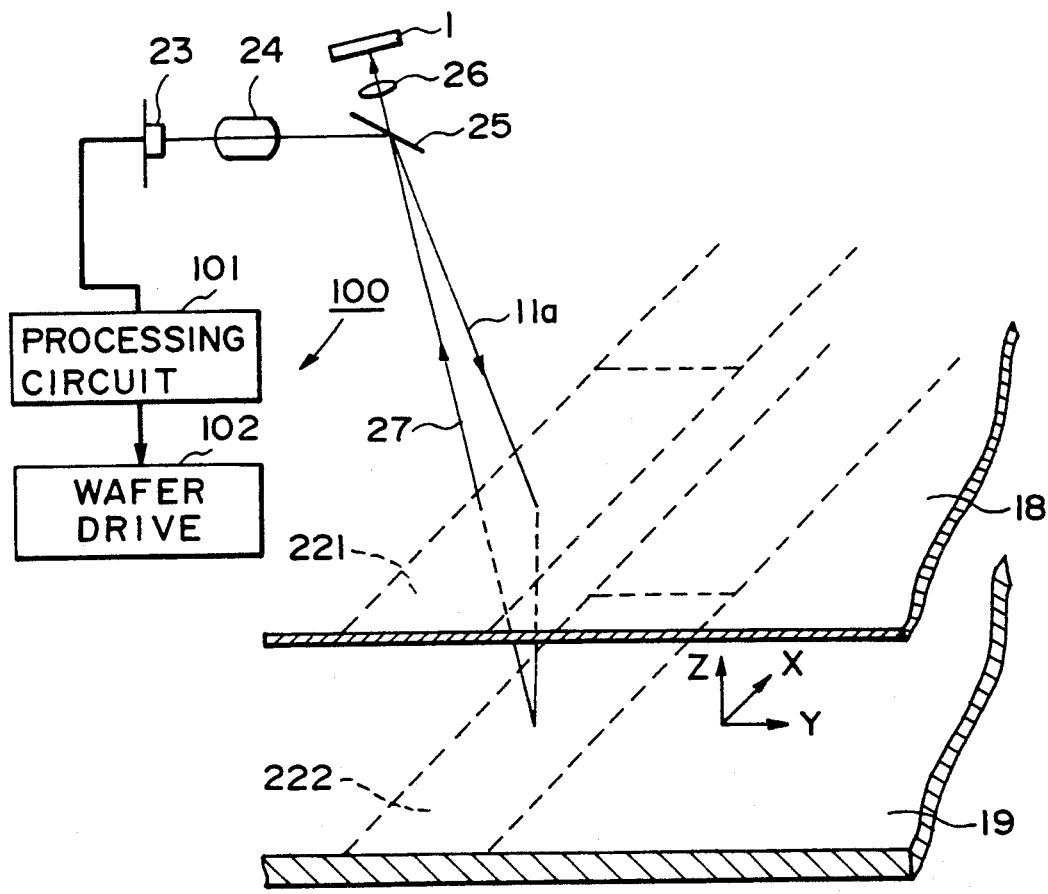
FIG. 8 is a perspective view schematically showing a position detecting system according to another embodiment of the present invention.

FIG. 8 is a schematic view showing a major part of a second embodiment of the present invention.

In this embodiment, light emanating from a light source 23 is collected by a light projecting lens system 24 and, after being reflected by a reflection mirror 25, it is projected obliquely onto a first physical optic element (such as a grating lens) 221 comprising an amplitude type or phase type zone plate, for example, provided on a mask (first object) 18 and having a rectangular peripheral shape.

The first physical optic element 221 has an optical power and has a light converging function, and the emitted diffraction light is converged at a point spaced from the first physical optic element by a predetermined distance. Then, this diffraction light is incident on a second physical optic element (such as a grating lens) 222 comprising a phase type or amplitude type zone plate, for example, provided on a wafer (second object) 19 disposed at a predetermined distance from the mask 18.

The second physical optic element 222 has a light converging function like that of the first physical optic element 221 or a light diverging function. The light emitted by the second physical optic element 222 (i.e. the diffraction light diffracted again by the element 222) passes through the first physical optic element 221 and it is converged by a condensing lens 26 upon the detection surface of a detector 1 which comprises a sensor array.

Namely, in this embodiment, the diffraction image of the first physical optic element 221 is imaged in an enlarged scale by the second physical optic element 222. Here, in accordance with any relative positional deviation $\Delta\sigma$ of the mask (first object) 18 and the wafer (second object) 19 in the x direction, there is produced a displacement $\Delta\delta$ of the gravity center position of the light incident on the detection surface of the detector 1, in the direction of the array of its sensors.

This is because, since the point of convergence of the light by the first physical optic element (which point is an object point) displaces relatively to the second physical optic element 222, the point of convergence of the emitted light on the detection surface of the detector 1 (which is the image of the first-mentioned point of convergence) displaces, too. The quantity $\Delta\delta$ of displacement of the gravity center position of the light on the detection surface is substantially proportional to the relative positional deviation $\Delta\delta$ between the first and second objects. Such a proportional relationship can be detected beforehand. Also, on the basis of trial printing, for example, as the mask 18 is set, such a gravity center position of the incident light upon the detection surface as assumed when the mask 18 and the wafer 19 have no relative positional deviation, may be determined as a reference position. Then, during an actual positional deviation detection operation, a displacement $\Delta\delta$ of the gravity center position of the received light from the reference position, in the direction of the array of the sensors, can be detected by the processing circuit 101. Thus, from the above proportional relationship, the positional deviation $\Delta\sigma$ of the wafer 19 with respect to the mask 18 can be determined. Driving means 102 then moves the wafer 19 so as to correct the detected positional deviation, whereby the mask-to-wafer alignment is accomplished. After this, the mask and the wafer are exposed with light or the like, whereby a circuit pattern of the mask is printed on the wafer, for manufacture of semiconductor chips.

Here, the term "center of gravity of light" means such a point that, when on the light detection surface the position vector of each point on that surface is multiplied by the light intensity of that point and the thus obtained products are integrated over the entire section, the integrated value has a "zero vector".

In this embodiment, as illustrated, the displacement $\Delta\delta$ of the gravity center position on the detection surface, of the light (diffraction light) provided by the light 27, is detected and, on the basis of this, the relative positional deviation $\Delta\sigma$ of the mask (first object) 18 and the wafer (second object) 19 is detected. Also in this embodiment, each edge of the patterns constituting the marks 221 and 222 is cut obliquely, like the preceding embodiment, and it is assured that upon the detector 1 surface the diffraction light 27 is separated from the regularly-reflected scattered light from these edges of the mark patterns. Thus, the displacement $\Delta\delta$ can be detected with selection of the diffraction light 27, in the same manner as in the preceding embodiment.

Referring next to FIGS. 9A–9E and 10, another embodiment of the present invention will be explained. The basic alignment structure of this embodiment is essentially the same as that of the embodiment shown in FIG. 8.

In this embodiment, a particular note is given to such an occasion that, in the neighborhood of a position detecting mark 221 on a mask 18 or a wafer 19, there is a pattern (such as a circuit pattern) separate from the mark 221 and that regularly-reflected scattered light from an edge of this pattern has an adverse effect.

In this embodiment, a projected light beam 11a has a substantial expansion on the mask 18 surface and is incident on a region 30 around the mark 221. Here, of the edge scattered lights 13a'–13c' produced from the circuit pattern 29, the light 13c' is received by the detector 1. The output signal of the detector 1 corresponding to the light 13c' is processed approximately by a signal processing circuit such as at 101 shown in FIG. 8.

In this embodiment, as illustrated in FIG. 9A showing the path in the projection to the mask 18 surface (x-y plane), the path for the light 11a to be projected from a light projecting system (FIG. 8) is set to be perpendicular to the direction of a scribe line 20M of the circuit pattern 29 on the mask 18. Also, the optical components are so set that, while the regularly-reflected scattered lights 13a'–13c' from straight edges of the circuit pattern 29, parallel to the scribe line 20M direction, go back along the direction of light projection as depicted by broken lines, the axis of light reception of the detector 1 is inclined by an angle $\theta$ with respect to the direction of incidence of the light, and that the flux of the regularly-reflected scattered lights 13a'–13c' from the edges advances in a direction different from that of emission of the diffraction light 27 from the marks 221 and 222. This assures that the diffraction light 27 is separated from the regularly-reflected scattered light 13c', upon the detector 1 surface.

In this case, the regularly-reflected lights 13a'–13c' produced by the circuit pattern 29 are scattered into 360 deg. directions about each straight portion of the edges. Thus, they are scattered into a range of about the width of the region 30 as defined by the projected light beam 11a, and they expand to the entire region sandwiched between the lights 13b' and 13c'.

Figures 9B, 9C:
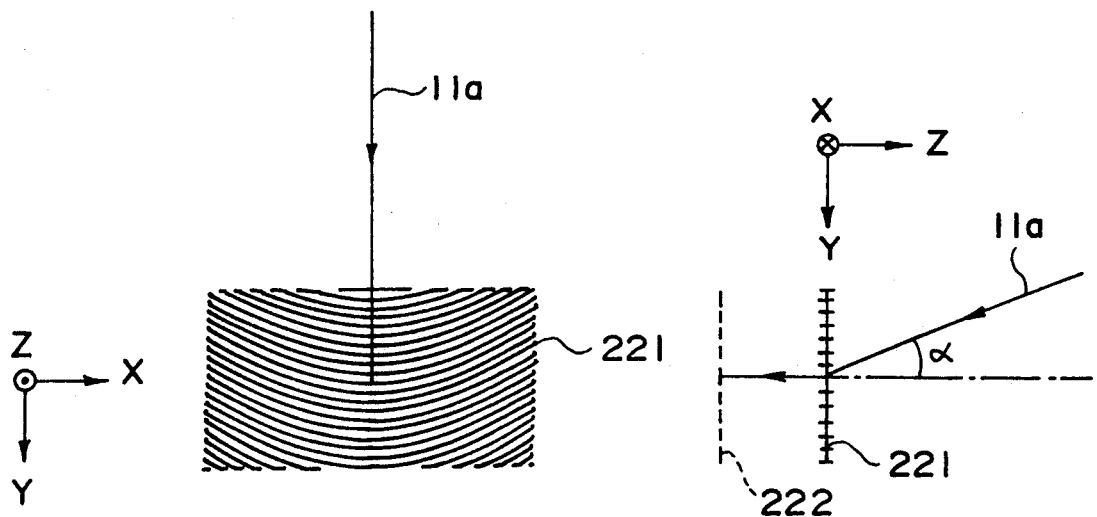
Figures 9D, 9E:
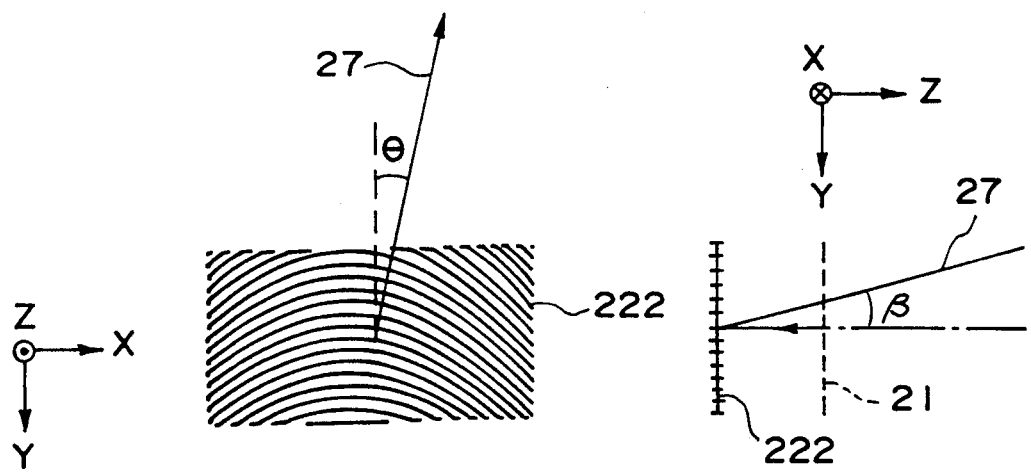

In this embodiment, the path of light projection and light reception is so set as illustrated in FIGS. 9B–9E. FIGS. 9B and 9D each corresponds to the x-y plane, and FIGS. 9C and 9E each corresponds to the y-z plane. FIG. 9B shows an alignment mark 221 of the mask 18, and it is so designed as to deflect the projected light beam 11a right down, as shown in FIGS. 9B and 9C, with convergence. FIG. 9D shows an alignment mark 222 of the wafer 19, and it is so designed as to deflect the diffraction light 27 with divergence, as shown in FIGS. 9D and 9E.

Figure 10:
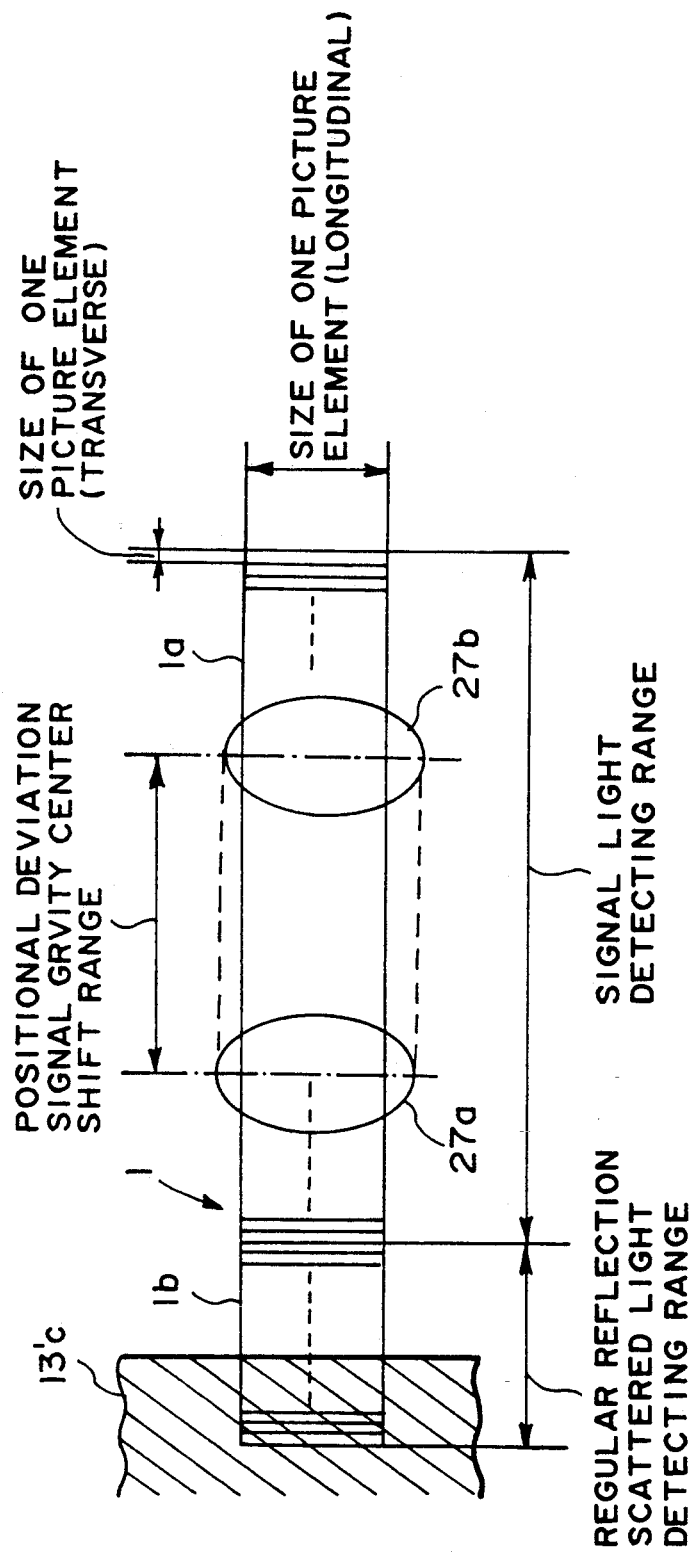
FIG. 10 is a schematic view for explaining the relationship of diffraction light and reflectively scattered light to a detection zone on a sensor array in the embodiment of FIG. 9A.

FIG. 10 is a schematic view for explaining the signal light 27 and the edge scattered light 13c' upon the detector 1 surface of the present embodiment.

Like the first embodiment, the detector 1 comprises a charge coupling type one-dimensional sensor (such as a CCD linear sensor) with a photoelectrically converting function, having picture elements of a number 2048 with a picture element size of 13 (transverse) × 130 (longitudinal) (microns).

In this embodiment, the gravity center position upon the detector 1 surface of the signal light 27, emanating from the mark (physical optic element) 221 and bearing positional information, displaces from a position 27a to a position 27b, in accordance with the relative positional deviation between the mask 18 and the wafer 19. The reference position corresponding to the attainment of correct alignment of the mask and the wafer, is at an intermediate position between the positions 27a and 27b. On the other hand, the regularly-reflected scattered light 13c' from an edge of the circuit pattern 29 is incident on a left-hand side end portion of the detector 1. The processing circuit 101 processes the signal in the manner to be described below.

From the arrangement of the light projecting system, the direction of elongation of each edge and the arrangement of the detecting system, an appropriate region for detecting the regularly-reflected scattered light is determined prior to the detector 1. Then, such a picture element, of those picture elements within this region showing intensity levels not lower than a predetermined, which picture element shows a maximum level, is detected. Thereafter, a range of ±n picture elements about the detected element, is set as the regularly-reflected light detecting region (noise detecting region) 1b, and the remaining area is set as the signal light detecting region 1a. If there is no picture element that shows an intensity level not lower than the predetermined, the entire area of the detector 1 is set as the signal light detecting region.

Next, without using the data corresponding to the signals from those picture elements having received the regularly-reflected scattered light, the gravity center position of the signal light within the signal light detecting region 1a is determined on the basis of the data corresponding to the signals from those picture elements in that region 1a. The alignment and exposure process to be made subsequently is the same as that having been described with reference to the embodiment of FIG. 8.

Figure 11:
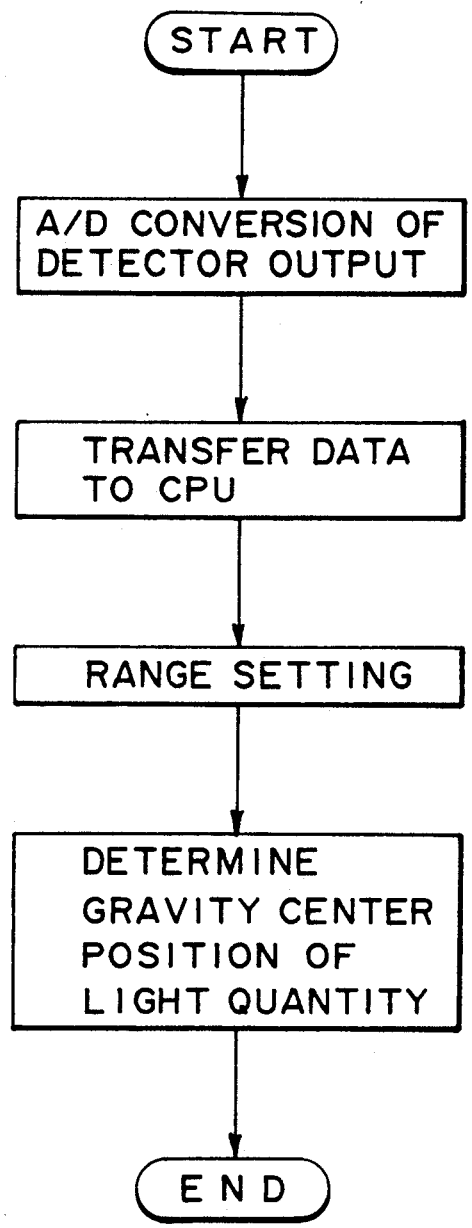
FIG. 11 is a flow chart showing the gravity center position determining procedure in the embodiment shown in FIG. 8 or 9A.

FIG. 11 is a flow chart showing the process of gravity center position determination to be made in the present embodiment or the embodiment of FIG. 8.

While the invention has been described with reference to the structures disclosed herein, it is not confined to the details set forth and this application is intended to cover such modifications or changes as may come within the purposes of the improvements or the scope of the following claims.

What is claimed is:

1. A position detecting method, wherein a radiation beam is projected to a grating pattern on a substrate, a diffraction beam from the pattern and a reflectively scattered beam from an edge of a peripheral portion of the pattern advancing in substantially the same direction as the diffraction beam from the pattern are received by a sensor array and the position of the substrate is determined on the basis of a signal from the sensor array, said method comprising:
   substantially separating the diffraction beam and the reflectively scattered beam from each other on the sensor array;
   processing a signal produced by the sensor array to extract a signal corresponding to the diffraction beam; and
   determining the position of the substrate on the basis of the extracted signal.

2. A method according to claim 1, wherein the grating pattern has an optical power, such that the position of incidence of the diffraction beam upon the sensor array changes with the position of the substrate.

3. A method according to claim 2, wherein the grating pattern comprises a zone plate.

4. A position detecting method, wherein a radiation beam is projected to a first substrate by which a diffraction beam is produced through a grating pattern on the first substrate and a grating mark on a second substrate, the produced diffraction beam and a reflectively scattered beam from an edge of a peripheral portion of the grating pattern advancing in substantially the same direction as the produced diffraction beam are received by a sensor array and the position of the second substrate relative to the first substrate is determined on the basis of a signal from the sensor array, said method comprising:
   substantially separating the diffraction beam and the reflectively scattered beam from each other on the sensor array;
   processing a signal produced by the sensor array to extract a signal corresponding to the diffraction beam; and
   determining the position of the second substrate relative to the first substrate on the basis of the extracted signal.

5. A method according to claim 4, wherein each of the grating pattern and the grating mark has an optical power, such that the position of incidence of the diffraction beam upon the sensor array changes with the position of the second substrate relative to the first substrate.

6. A method according to claim 5, wherein each of the grating pattern and the grating mark comprises a zone plate.

7. A method according to claim 4, further comprising determining the position of the second substrate relative to the first substrate on the basis of the intensity of the extracted signal.

8. A position detecting method, wherein a radiation beam is projected to a linear zone plate on a first substrate by which a linear beam is produced, the produced linear beam is projected to a linear grating mark on a second substrate, a diffraction beam emanating from the grating mark in a predetermined direction and a reflectively scattered beam from an edge of a peripheral portion of the zone plate are received by a sensor array, the position of the second substrate relative to the first substrate is determined on the basis of a signal from the sensor array and the intensity of the diffraction beam changes with the position of the linear grating mark relative to the linear beam, said method comprising:
   substantially separating the diffraction beam and the reflectively scattered beam from each other on the sensor array;
   processing a signal produced by the sensor array to extract a signal corresponding to the diffraction beam; and
   determining the position of the second substrate relative to the first substrate on the basis of the extracted signal.

9. A position detecting method, wherein a radiation beam is projected to a first zone plate on a first substrate, a diffraction beam from the first zone plate is projected to a second zone plate on a second substrate, the diffraction beam diffracted again by the second zone plate and a reflectively scattered beam from an edge of a peripheral portion of the first zone plate advancing in substantially the same direction as the diffraction beam from the first zone plate are received by a sensor array, the position of the second substrate relative to the first substrate is determined on the basis of a signal from the sensor array, and the position of incidence of the diffraction beam upon the sensor array changes with the position of the second zone plate relative to the first zone plate, said method comprising: substantially separating the diffraction beam and the reflectively scattered beam from each other on the sensor array;

processing a signal produced by the sensor array to extract a signal corresponding to the diffraction beam; and determining the position of the second substrate relative to the first substrate on the basis of the extracted signal.

10. A semiconductor device manufacturing method, wherein a radiation beam is projected to a mask by which a diffraction beam is produced through a grating pattern on the mask and a grating mark on a wafer, the diffraction beam and a reflectively scattered beam from an edge of a peripheral portion of the grating pattern advancing in substantially the same direction as the diffraction beam are received by a sensor array, any positional deviation of the wafer with respect to the mask is determined on the basis of a signal from the sensor array and wherein, after the mask and the wafer are aligned with each other on the basis of the determination, a circuit pattern of the mask is printed on the wafer, said method comprising:

substantially separating the diffraction beam and the reflectively scattered beam from each other on the sensor array; processing a signal produced by the sensor array to extract a signal corresponding to the diffraction beam; and determining the positional deviation of the wafer with respect to the mask on the basis of the extracted signal.

11. A semiconductor device manufacturing method, wherein a radiation beam is projected to a linear zone plate on a mask by which a linear beam is produced, the produced linear beam is projected to a linear grating mark on a wafer, a diffraction beam emanating from the grating mark in a predetermined direction and a reflectively scattered beam from an edge of a peripheral portion of the zone plate advancing in substantially the same direction as the diffraction beam are received by a sensor array, any positional deviation of the wafer with respect to the mask is determined on the basis of a signal from the sensor array, wherein, after alignment of the mask and the wafer based on the determination, the wafer is exposed to a circuit pattern of the mask whereby the latter is printed on the former, and the intensity of the diffraction beam changes with the position of the linear grating mark relative to the linear beam, said method comprising:

substantially separating the diffraction beam and the reflectively scattered beam from each other on the sensor array;

processing a signal produced by the sensor array to extract a signal corresponding to the diffraction beam; and determining the positional deviation of the wafer with respect to the mask on the basis of the extracted signal.

12. A semiconductor device manufacturing method, wherein a radiation beam is projected to a first zone plate on a mask, a diffraction beam from the first zone plate is projected to a second zone plate on a wafer, the diffraction beam diffracted again by the second zone plate and a reflectively scattered beam from an edge of a peripheral portion of the first zone plate advancing in substantially the same direction as the diffraction beam from the first zone plate are received by a sensor array, any positional deviation of the wafer with respect to the mask is determined on the basis of a signal from the sensor array, wherein, after alignment of the mask and the wafer based on the determination, the wafer is exposed to a circuit pattern of the mask whereby the latter is printed on the former, and the position of incidence of the diffraction beam upon the sensor array changes with the position of the second zone plate relative to the first zone plate, said method comprising:

substantially separating the diffraction beam and the reflectively scattered beam from each other on the sensor array;

processing a signal produced by the sensor array to extract a signal corresponding to the diffraction beam; and determining the positional deviation of the wafer with respect to the mask on the basis of the extracted signal.

13. An alignment and exposure apparatus for aligning a mask and a wafer by using a zone plate on the mask and a linear grating mark on the wafer and for exposing the wafer to a circuit pattern of the mask, wherein the zone plate and the grating mark are so arranged that an intensity of a diffraction beam which is produced by projecting a linear beam, formed by the zone plate, to the linear grating mark and which emanates from the grating mark along a predetermined direction, changes with the position of the grating mark relative to the linear beam, said apparatus comprising:

means for projecting a radiation beam to the mask to produce the linear beam and a reflectively scattered beam;

a linear receiving optical system comprising a sensor array for receiving the diffraction beam, wherein said light receiving optical system is correlated with the zone plate so that the diffraction beam and a reflectively scattered beam produced by an edge of a peripheral portion of the zone plate advancing in substantially the same direction as the diffraction beam are separated from each other upon said sensor array;

processing means for processing an output signal produced by said sensor array, said processing means comprising means for extracting a signal, out of the output signal, corresponding to the diffraction beam and for determining any positional deviation of the wafer with respect to the mask on the basis of the extracted signal; and means for changing the position of the wafer relative to the mask to correct the determined positional deviation.

14. An alignment and exposure apparatus for aligning a mask and a wafer by using a first zone plate on the mask and a second zone plate on the wafer and for exposing the wafer to a circuit pattern of the mask, wherein the first and second zone plates are so arranged that a position on a predetermined plane of a diffraction beam diffracted by the first and second zone plates, respectively, changes with the position of the second zone plate relative to the first zone plate, said apparatus comprising:

means for projecting a radiation beam to the mask to produce the diffraction beam and a reflectively scattered beam;

a light receiving optical system comprising a sensor array provided on the predetermined plate, for receiving the diffraction beam, wherein said light receiving optical system is correlated with the first zone plate so that the diffraction beam and a relatively scattered beam produced by an edge of a peripheral portion of the first zone plate advancing in substantially the same direction as the diffraction beam are separated from each other upon said sensor array;

processing means for processing an output signal produced by said sensor array, said processing means comprising means for extracting a signal, out of the output signal, corresponding to the diffraction beam and for determining any positional deviation of the wafer with respect to the mask on the basis of the extracted signal; and means for changing the position of the wafer relative to the mask to correct the determined positional deviation.

15. An alignment and exposure apparatus for aligning a mask and a wafer by using a grating pattern on the mask and a grating mark on the wafer and for exposing the wafer to a circuit pattern of the mask, wherein the grating pattern and the grating mark are so arranged that a diffraction beam produced through the grating pattern and the grating mark bears information representing the position of the grating mark relative to the grating pattern, said apparatus comprising:

means for projecting a radiation beam to the mask to produce the diffraction beam and a reflectively scattered beam;

a light receiving optical system comprising a sensor array for receiving the diffraction beam, wherein said light receiving optical system is correlated with the grating pattern so that the diffraction beam and a reflectively scattered beam produced by an edge of a peripheral portion of the grating pattern advancing in substantially the same direction as the diffraction beam are separated from each other upon said sensor array;

processing means for processing an output signal produced by said sensor array, said processing means comprising means for extracting a signal, out of the output signal, corresponding to the diffraction beam and for determining any positional deviation of the wafer with respect to the mask on the basis of the extracted signal; and means for changing the position of the wafer relative to the mask to correct the determined positional deviation.

16. A position detecting method, wherein a radiation beam is projected to a grating pattern on a substrate, a diffraction beam from the pattern and a reflectively scattered beam from an edge of a peripheral portion of another pattern, adjacent to the grating position are received by a sensor array, and the position of the substrate is determined on the basis of a signal from the sensor array, said method comprising:

substantially separating the diffraction beam and the reflectively scattered beam from each other on the sensor array;

processing a signal produced by the sensor array to extract a signal corresponding to the diffraction beam; and determining the position of the substrate on the basis of the extracted signal.

17. A method according to claim 16, wherein the grating pattern has an optical power, such that the position of incidence of the diffraction beam upon the sensor array changes with the position of the substrate.

18. A method according to claim 17, wherein the grating pattern comprises a zone plate.

19. A position detecting method, wherein a radiation beam is projected to a first substrate by which a diffraction beam is produced through a grating pattern on the first substrate and a grating mark on a second substrate, the produced diffraction beam and a reflectively scattered beam from an edge of a peripheral portion of another pattern, adjacent to the grating pattern, are received by a sensor array and the position of the second substrate relative to the first substrate is determined on the basis of a signal from the sensor array, said method comprising:

substantially separating the diffraction beam and the reflectively scattered beam from each other on the sensor array;

processing a signal produced by the sensor array to extract a signal corresponding to the diffraction beam; and determining the position of the second substrate relative to the first substrate on the basis of the extracted signal.

20. A method according to claim 19, wherein each of the grating pattern and the grating mark has an optical power, such that the position of incidence of the diffraction beam upon the sensor array changes with the position of the second substrate relative to the first substrate.

21. A method according to claim 19, wherein each of the grating pattern and the grating mark comprises a zone plate.

22. A method according to claim 19, further comprising determining the position on the basis of the intensity of the extracted signal.

23. A position detecting method, wherein a radiation beam is projected to a first zone plate on a first substrate, a diffraction beam from the first zone plate is projected to a second zone plate on a second substrate, the diffraction beam diffracted again by the second zone plate and a reflectively scattered beam from an edge of a peripheral portion of a pattern, adjacent to the first zone plate, are received by a sensor array, the position of the second substrate relative to the first substrate is determined on the basis of a signal from the sensor array and the position of incidence of the diffraction beam upon the sensor array changes with the position of the second zone plate relative to the first zone plate, said method comprising:

substantially separating the diffraction beam and the reflectively scattered beam from each other on the sensor array;

processing a signal produced by the sensor array to extract a signal corresponding to the diffraction beam; and determining the position of the second substrate relative to the first substrate on the basis of the extracted signal.

24. A semiconductor device manufacturing method, wherein a radiation beam is projected to a mask by which a diffraction beam is produced through a grating pattern on the mask and a grating mark on a wafer, the diffraction beam and a reflectively scattered beam from an edge of a peripheral portion of a circuit pattern, adjacent to the grating pattern, are received by a sensor array, any positional deviation of the wafer with respect to the mask is determined on the basis of a signal from the sensor array and wherein, after the mask and the wafer are aligned with each other on the basis of the determination, a circuit pattern of the mask is printed on the wafer, said method comprising:
   substantially separating the diffraction beam and the reflectively scattered beam from each other on the sensor array;
   processing a signal produced by the sensor array to extract a signal corresponding to the diffraction beam; and
   determining the positional deviation of the wafer with respect to the mask on the basis of the extracted signal.

25. A semiconductor device manufacturing method, wherein a radiation beam is projected to a first zone plate on a mask, a diffraction beam from the first zone plate is projected to a second zone plate on a wafer, the diffraction beam diffracted again by the second zone plate and a reflectively scattered beam from an edge of a peripheral portion of a circuit pattern, adjacent to the first zone plate, are received by a sensor array, any positional deviation of the wafer with respect to the mask is determined on the basis of a signal from the sensor array, wherein, after alignment of the mask and the wafer based on the determination, the wafer is exposed to a circuit pattern of the mask whereby the latter is printed on the former, and the position of incidence of the diffraction beam upon the sensor array changes with the position of the second zone plate relative to the first zone plate, said method comprising:
   substantially separating the diffraction beam and the reflectively scattered beam from each other on the sensor array; processing a signal produced by the sensor array to extract a signal corresponding to the diffraction beam; and
   determining the positional deviation of the wafer with respect to the mask on the basis of the extracted signal.

26. An alignment and exposure apparatus for aligning a mask and a wafer by using a first zone plate on the mask and a second zone plate on the wafer and for exposing the wafer to a circuit pattern of the mask, wherein the first and second zone plates are so arranged that a position on a predetermined plane of a diffraction beam diffracted by the first and second zone plates, respectively, changes with the position of the second zone plate relative to the first zone plate, said apparatus comprising:
   means for projecting a radiation beam to the mask to produce the diffraction beam and a reflectively scattered beam;
   a light receiving optical system comprising a sensor array provided on the predetermined plane, for receiving the diffraction beam, wherein said light receiving optical system is correlated with the first zone plate so that the diffraction beam and a reflectively scattered beam produced by an edge of a peripheral portion of the circuit pattern, adjacent to the first zone plate, are separated from each other upon said sensor array;
   processing means for processing an output signal produced by said sensor array, said processing means comprising means for extracting a signal, out of the output signal, corresponding to the diffraction beam and for determining any positional deviation of the wafer with respect to the mask on the basis of the extracted signal; and
   means for changing the position of the wafer relative to the mask to correct the determined position deviation.

27. An alignment and exposure apparatus for aligning a mask and a wafer by using a grating pattern on the mask and a grating mark on the wafer and for exposing the wafer to a circuit pattern of the mask, wherein the grating pattern and the grating mark are so arranged that a diffraction beam produced through the grating pattern and the grating mark bears information representing the position of the grating mark relative to the grating pattern, said apparatus comprising:
   means for projecting a radiation beam to the mask to produce the diffraction beam and a reflectively scattered beam;
   a light receiving optical system comprising a sensor array for receiving the diffraction beam, wherein said light receiving optical system is correlated with the grating pattern so that the diffraction beam and a reflectively scattered beam produced by an edge of a peripheral portion of the circuit pattern, adjacent to the grating pattern, are separated from each other upon said sensor array;
   processing means for processing an output signal produced by said sensor array, said processing means comprising means for extracting a signal, out of the output signal, corresponding to the diffraction beam and for determining any positional deviation of the wafer with respect to the mask on the basis of the extracted signal; and
   means for changing the position of the wafer relative to the mask to correct the determined positional deviation.

28. A semiconductor device manufactured by a method wherein a radiation beam is projected to a mask by which a diffraction beam is produced through a grating pattern on the mask and a grating mark on a wafer, the diffraction beam and a reflectively scattered beam which emanates from an edge of a peripheral portion of the grating pattern and which advances substantially in the same direction as the diffraction beam are received by a sensor array, any positional deviation of the wafer with respect to the mask is determined on the basis of a signal from the sensor array, and wherein, after the mask and the wafer are aligned with each other on the basis of the determination, a circuit pattern of the mask is printed on the wafer, said method comprising:
   substantially separating the diffraction beam and the reflectively scattered beam from each other on the sensor array;
   processing a signal produced by the sensor to extract a signal corresponding to the diffraction beam; and
   determining the positional deviation of the wafer with respect to the mask on the basis of the extracted signal.

29. A semiconductor device manufactured by a method wherein a radiation beam is projected to a mask by which a diffraction beam is produced through a grating pattern on the mask and a grating mark on a wafer, the diffraction beam and a reflectively scattered beam from an edge of a peripheral portion of a circuit pattern of the mask, adjacent to the grating pattern are received by a sensor array, any positional deviation of the wafer with respect to the mask is determined on the basis of a signal from the sensor array, and wherein, after the mask and the wafer are aligned with each other on the basis of the determination, the circuit pattern of the mask is printed on the wafer, said method comprising:

substantially separating the diffraction beam and the reflectively scattered beam from each other on the sensor array;

processing a signal produced by the sensor array to extract a signal corresponding to the diffraction beam; and determining the positional deviation of the wafer with respect to the mask on the basis of the extracted signal.

* * * * *

UNITED STATES PATENT AND TRADEMARK OFFICE
CERTIFICATE OF CORRECTION

PATENT NO. : 5,285,259
DATED : February 8, 1994
INVENTOR(S) : KENJI SAITOH

It is certified that error appears in the above-indentified patent and that said Letters Patent is hereby corrected as shown below:

ON THE TITLE PAGE

IN THE ABSTRACT:

Line 1, "disclosed" should read --disclosed wherein--; and
      Line 3, "wherein" should be deleted.

IN THE DRAWINGS:

FIGURE 10:

"GRVITY" should read --GRAVITY--.

COLUMN 6:

Line 56, "it" should read --its--.

COLUMN 7:

Line 19, "portion" should read --portion of--.

UNITED STATES PATENT AND TRADEMARK OFFICE
CERTIFICATE OF CORRECTION

PATENT NO. : 5,285,259
DATED : February 8, 1994
INVENTOR(S) : KENJI SAITOH

It is certified that error appears in the above-indentified patent and that said Letters Patent is hereby corrected as shown below:

COLUMN 10:

Line 53, "corresponds" should read --correspond--; and
Line 54, "corresponds" should read --correspond--.

COLUMN 13:

Line 36, "sensor array; processing a signal produced by the" should read
--sensor array;
¶processing a signal produced by the--.

COLUMN 14:

Line 42, "linear" should read --light--.

COLUMN 15:

Line 62, "position" should read --pattern,--.

COLUMN 17:

Line 40, "sensor array; processing a signal produced by the" should read
--sensor array;
¶processing a signal produced by the--.

UNITED STATES PATENT AND TRADEMARK OFFICE
CERTIFICATE OF CORRECTION

PATENT NO. : 5,285,259
DATED : February 8, 1994
INVENTOR(S) : KENJI SAITOH

It is certified that error appears in the above-indentified patent and that said Letters Patent is hereby corrected as shown below:

COLUMN 18:

Line 58, "sensor" should read --sensor array--.

Signed and Sealed this

Thirteenth Day of September, 1994

Attest:

BRUCE LEHMAN

Attesting Officer    Commissioner of Patents and Trademarks